(12) United States Patent
Jeong

(10) Patent No.: US 6,187,636 B1
(45) Date of Patent: Feb. 13, 2001

(54) FLASH MEMORY DEVICE AND FABRICATION METHOD THEREOF

(75) Inventor: Hee-Cheol Jeong, Cheongju (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/020,503

(22) Filed: Feb. 9, 1998

(30) Foreign Application Priority Data

Mar. 14, 1997 (KR) .................................................. 97/8652

(51) Int. Cl.$^7$ ................................................ H01L 21/336
(52) U.S. Cl. .................... 438/267; 438/257; 438/261; 438/304; 438/305; 438/596
(58) Field of Search .................................. 438/304, 596, 438/305, 257, 261, 267

(56) References Cited

U.S. PATENT DOCUMENTS

| | | | |
|---|---|---|---|
| 4,925,807 | * | 5/1990 | Yoshikawa ............................. 438/304 |
| 5,478,767 | * | 12/1995 | Hong .................................... 438/267 |
| 5,599,726 | * | 2/1997 | Pan ...................................... 438/304 |
| 5,620,914 | * | 4/1997 | Hikida et al. .......................... 438/304 |
| 5,654,212 | * | 8/1997 | Jang ..................................... 438/231 |
| 5,716,866 | * | 2/1998 | Dow et al. ............................ 438/286 |
| 5,824,584 | * | 10/1998 | Chen et al. ........................... 438/267 |
| 5,920,783 | * | 7/1999 | Tseng et al. .......................... 438/305 |
| 6,001,683 | * | 12/1999 | Lee ...................................... 438/241 |

OTHER PUBLICATIONS

"Comparison and Trends in Today's Dominant E$^2$ Technologies", S.K. Lai et al., IEDM Tech. Dig., pp. 580–583, (1986).

* cited by examiner

Primary Examiner—Mahshid Saadat
Assistant Examiner—N. Drew Richards
(74) Attorney, Agent, or Firm—Fleshner & Kim, LLP

(57) ABSTRACT

A flash memory device and fabrication method simplify the fabrication process of a semiconductor EEPROM device through a self-aligning process. The device includes a semiconductor substrate in which source and drain regions are defined, a first insulation layer formed on the semiconductor substrate, a first conductive layer pattern formed on a portion of the first insulation layer, sidewall spacers formed of a second conductive layer neighboring each sidewall of the first conductive layer pattern and covered by second and third insulation layers, and a third conductive layer pattern formed on the insulation layers and connected with the first conductive layer pattern.

12 Claims, 3 Drawing Sheets

FLASH MEMORY DEVICE AND FABRICATION METHOD THEREOF

BACKGROUND OF THE INVENTION

1. Field of the Invention

The present invention relates to memory devices and, in particular, to a flash memory device and a fabrication method thereof.

2. Background of the Related Art

FIG. 1 illustrates a related art Floating-gate Tunneling Oxide (FLOTOX) Electrically Erasable and Programmable Read Only Memory (EEPROM). An active region 1a and a field region 1b are formed on the upper surface of a semiconductor substrate 1. In the semiconductor substrate 1, source and drain regions 2 and 3 are formed. A gate insulation layer 4 and a tunnel insulation layer 5 are formed within the active region 1a of the semiconductor substrate 1. A first conductive layer (floating gate) 6 is formed on the upper surfaces of the gate insulation layer 4 and the tunnel insulation layer 5. An interlayer insulation film 7 is formed on the upper surface of the first conductive layer 6. A second conductive layer (control gate) 8 is formed on the upper surface of the interlayer insulation film 7. An insulation film 9 is formed on the upper surfaces of the semiconductor substrate 1 and the second conductive layer 8.

In operation, twenty volts (20V) is supplied to the control gate 8 and zero volts (0V) is supplied to the drain 3. The source 2 and the substrate 1 are connected to ground. Electrons are injected into the floating gate 6 from the drain 3 through the tunnel insulation layer 5 via a Folwer-Nordheim (FN) tunneling effect. Electrons accumulate in the floating gate 6, the threshold voltage of the device increases, and the intensity of the electric field, which is applied from the control gate 8 to the drain 3, increases.

To erase the data from the FLOTOX EEPROM, the source 2 and the semiconductor substrate 1 are connected to ground, zero volts is supplied to the control gate 8 and twenty volts are supplied to the drain 3. Electrons accumulated in the floating gate 6 are moved into the drain region 3 through the tunnel insulation layer 5 via the FN tunneling effect. Since the number of electrons in the floating gate 6 decrease, the threshold voltage of the FLOTOX EEPROM decreases, and the intensity of the electric field, which is applied from the drain 3 to the control gate 8, also decreases.

The related art FLOTOX EEPROM requires a high voltage during programming and data erasing operations, and a high substrate current is generated due to the high voltage during data erasing operations. As a result, the characteristics of the FLOTOX EEPROM and the tunnel insulation layer 5 are quickly degraded.

In addition, due to the high substrate current generated, it is not possible to erase the data in the related art FLOTOX EEPROM using a 5-volt power source. Furthermore, it is not possible to perform a self-aligning process during the fabrication process for the related art FLOTOX EEPROM.

The above references are incorporated by reference herein where appropriate for appropriate teachings of additional or alternative details, features and/or technical background.

SUMMARY OF THE INVENTION

Accordingly, it is an object of the present invention to provide a flash memory device and a flash memory fabrication method that overcome the aforementioned problems encountered in the related art.

It is another object of the present invention to perform a data erasure at a low voltage.

It is another object of the present invention to simplify the fabrication process of the memory device through a self-aligning process.

To achieve the above objects, there is provided a flash memory device comprising: (1) a semiconductor substrate; (2) a source region and a drain region in the semiconductor substrate; (3) a first insulation layer formed on the semiconductor substrate; (4) a first conductive layer formed on a portion of the first insulation layer; (5) first and second conductive sidewall spacers positioned adjacent to first and second sidewalls of the first conductive layer, respectively; (6) a second insulation layer formed on the first and second sidewall conductive sidewall spacers; and (7) a second conductive layer formed on the insulation layer, the second conductive layer in electrical contact with the first conductive layer.

To achieve the above objects, there is also provided a flash memory device fabrication method, which comprises the steps of: (1) forming a first insulation layer on a semiconductor substrate; (2) forming a first conductive layer pattern on a portion of the first insulation layer; (3) forming low density impurity regions in the semiconductor substrate; (4) forming a second insulation layer on sidewalls of the first conductive layer pattern; (5) forming, on each of the two sides of the first conductive layer pattern, a conductive sidewall spacer on the second insulation layer and the first insulation layer; (6) forming high density impurity regions in the semiconductor substrate; (7) forming a third insulation layer that covers the conductive sidewall spacers and that contacts the first and second insulation layers; and (8) forming a third conductive layer pattern on the first, second and third insulation layers, the third conductive layer pattern in electrical contact with the first conductive layer pattern.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
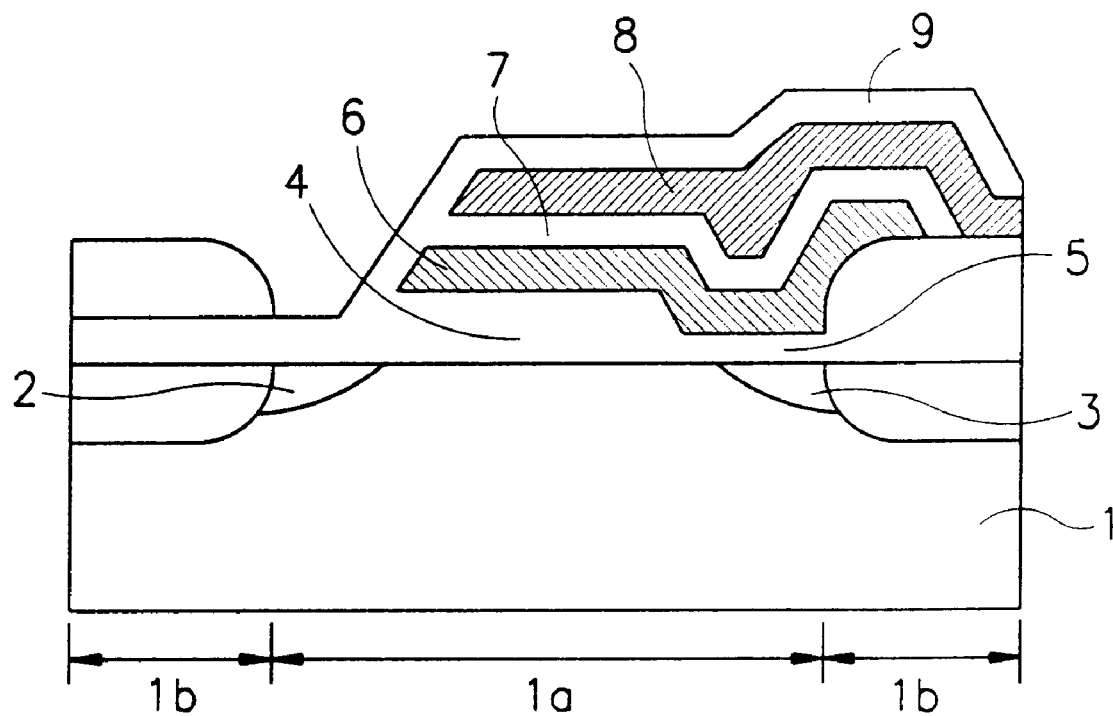
FIG. 1 is a horizontal cross-sectional view of related art floating-gate tunneling oxide (FLOTOX) EEPROM.
Figure 2:
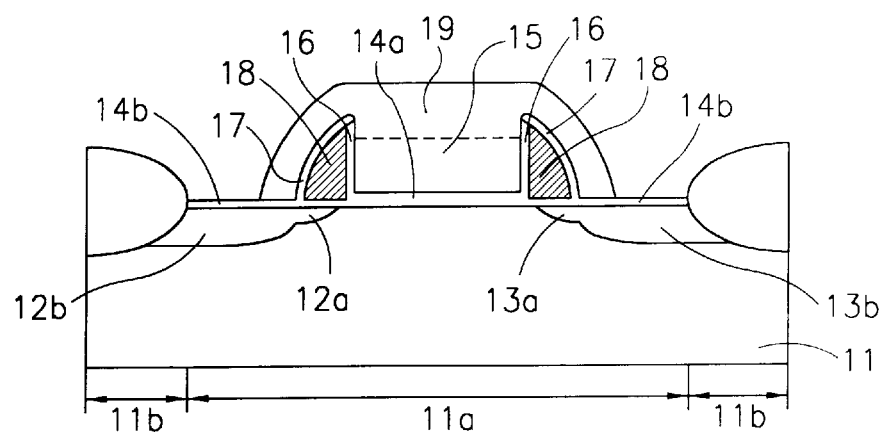
FIG. 2 is a horizontal cross-sectional view of a flash memory device according to the present invention.
Figure 3:
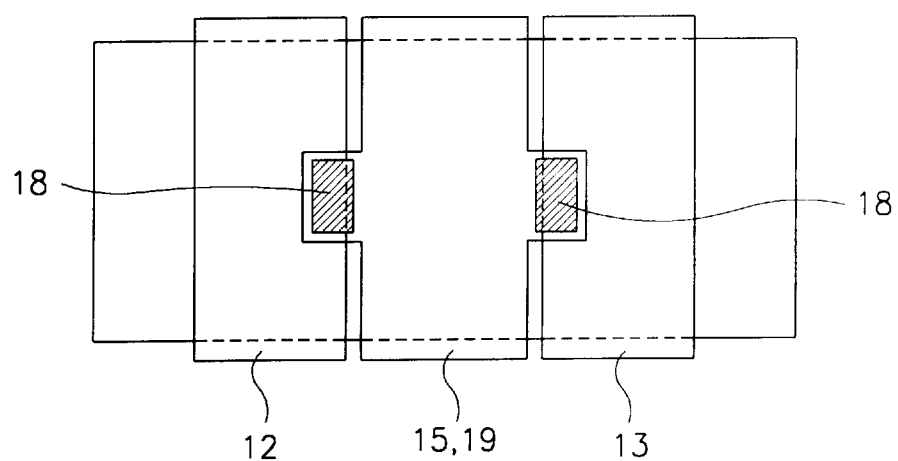
FIG. 3 is a plan view of the flash memory device of FIG. 2.

FIGS. 2 and 3 illustrate a flash memory device according to the present invention. As shown therein, the flash memory device according to the present invention comprises a semiconductor substrate 11 having an active region 11a and field regions 11b formed thereon, and source and drain regions 12 and 13, respectively, defined in the semiconductor substrate 11. The source region 12 and the drain region 13 include low density doping regions 12a and 13a, respectively, and high density doping regions 12b and 13b, respectively. In addition, a first insulation layer 14 is formed on the active region 11a of the semiconductor substrate 11. The first insulation layer 14 includes a gate insulation layer 14a, and a tunnel insulation layer 14b formed on the upper surfaces of the source and drain regions 12 and 13.

A first conductive layer (first control gate) 15 is formed on the upper surface of the gate insulation layer 14a. Second conductive layer sidewall spacer (floating gate) 18 are formed on each sidewall of the first control gate 15, and are covered by a second insulation layer (sidewall insulation layer) 16 and a third insulation layer (sidewall insulation layer) 17. In addition, a third conductive layer pattern (second control gate) 19 is formed on the upper surfaces of the insulation layers 14,16 and 17, and is connected with the first control gate 15.

Figure 4A:
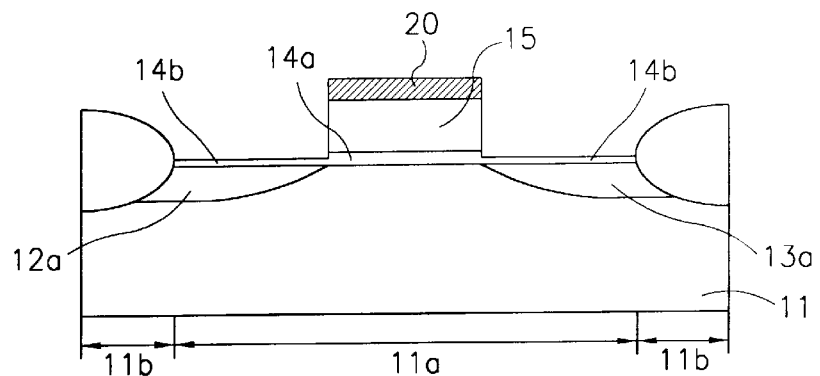
FIGS. 4A–4C are cross-sectional views illustrating process steps of a preferred method for fabricating a flash memory device according to the present invention.

As shown in FIG. 4A, an active region 11a and a field region 11b are defined on the upper surface of the semiconductor substrate 11, e.g., a P-type substrate, preferably by a LOCOS process. A first insulation layer (not shown) is deposited on the semiconductor substrate 11, preferably by a CVD method, and a predetermined portion of the active region 11a is patterned in order to form a gate insulation layer 14a. On the remaining portions of the active region 11a, a tunnel insulation layer 14b is formed thinner than the thickness of the gate insulation layer 14a. A first conductive layer (not shown) is deposited on the upper surface of the semiconductor substrate 11 including the gate insulation layer 14a, preferably by a CVD method, and the resultant structure is patterned. The first conductive pattern (first control gate) 15 is then formed on the upper surface of the gate insulation layer 14a.

Thereafter, low density impurity regions (source/drain regions) 12a and 13a are formed, preferably by ion-implanting impurities into the semiconductor substrate 11 using the gate insulation layer 14a and the first control gate 15 as a mask. A nitride film (not shown) is deposited on the semiconductor substrate 11, including the first control gate 15, and the resultant structure is patterned. The nitride film pattern 20 is then formed by leaving the nitride film (not shown) on only the upper surface of the first control gate 15.

Figure 4B:
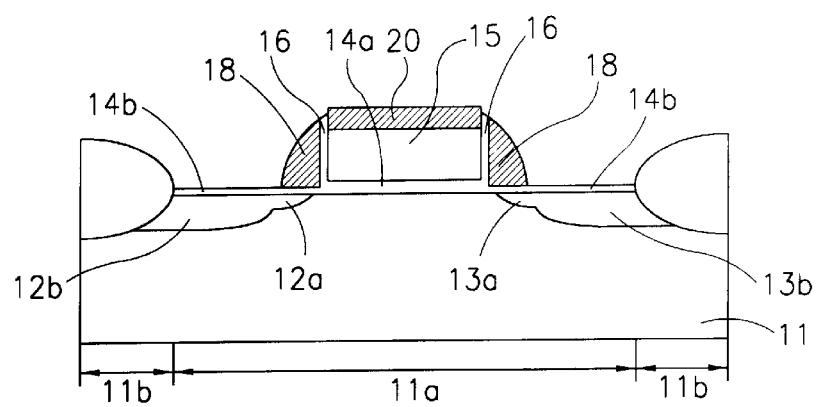

Referring to FIG. 4B, a second insulation layer (not shown) and a second conductive layer (not shown) are sequentially formed on the upper surface of the structure of FIG. 4A, including the nitride film pattern 20, preferably by a CVD process. The second insulation layer and the second conductive layer are then dry-etched, and a sidewall insulation layer 16 and second conductive layer sidewall spacer (floating gate) 18 are formed by forming the second insulation layer (sidewall insulation layer) (not shown) and the second conductive layer (not shown) on the sidewall surfaces of the first control gate 15 and the nitride film pattern 20. Next, the upper surface of the nitride film pattern 20 is externally exposed. A high density of impurities are then ion-implanted into the semiconductor substrate 11 by using the nitride film pattern 20 and the floating gate 18 as a mask, thereby defining the source and drain regions 12 and 13, respectively, having high density impurity regions neighboring with the low density impurity regions.

Figure 4C:
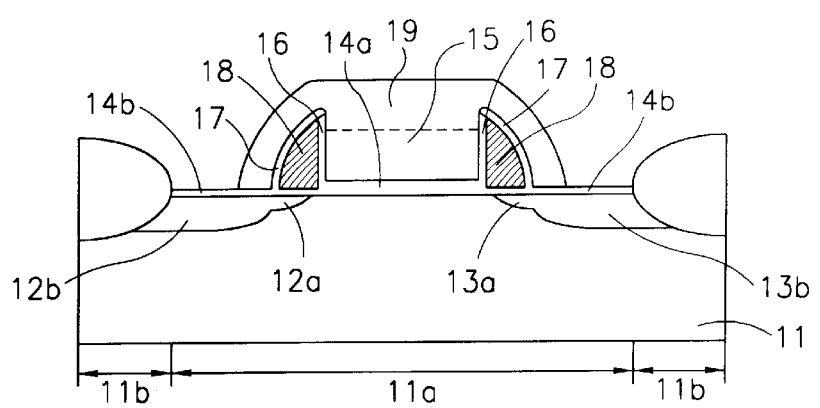

Referring to FIG. 4C, the nitride film pattern 20 is etched, and a third insulation layer 17 is deposited on the upper surfaces of the first control gate 15, the floating gate 18, the first insulation layer 14, and the second insulation layer 16. Then, the portion of the third insulation layer 17 formed on the upper surface of the first control gate 15 is etched by using an etching mask. Thereafter, a third conductive layer (not shown) is deposited on the upper surfaces of the first control gate 15 and third insulation layer (sidewall insulation layer) 17, preferably by a CVD process. The resultant structure is then patterned and connected with the first control gate 15, thereby forming a third conductive layer pattern (second control gate) 19. This completes the fabrication of the flash memory device structure according to the present invention.

To program the flash memory device, a positive low voltage is first supplied to the second control gate 19, a negative low voltage is applied to the source and drain regions 12 and 13, and the semiconductor substrate 11 is grounded. Based on the electrical field formed between the second control gate 19 and the source and drain 12 and 13, electrons from the source and drain regions 12 and 13 are injected into each floating gate 18 through the tunnel insulation layer 14b via the FN tunneling effect. When electrons have accumulated in the floating gate 18, the threshold voltage of the flash memory device is increased, and the intensit, of the electric field is increased.

During the data erasure operation, a negative low voltage is supplied to the second control gate 19, a positive low voltage is supplied to the source and drain regions 12 and 13, and the semiconductor substrate 11 is connected to ground. Based on the electrical field formed between the source and drain regions 12 and 13, and the second control gate 19, electrons accumulated in the floating gate 18 are injected into the source and drain regions 12 and 13 through the tunnel insulation layer 14b via the FN tunneling effect. As a result, the number of electrons from the floating gate 18 is reduced, the threshold voltage of the flash memory device is decreased, and the intensity of the electric field is decreased.

As described above, the flash memory device and fabrication method according to the present invention provide a flash memory which is capable of rapidly performing data erasure and programming operations at low voltage by forming a floating gate on both sidewalls of the control gate and on the low density impurity regions (source and drain), simplifying the fabrication process by using a self-aligning process, and controlling the size of the floating gate.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An method of making a memory device, comprising the steps of:

forming a first insulation layer on a substrate;

forming a first conductive layer on a portion of the first insulation layer;

forming impurity regions in the substrate;

forming a second insulation layer on sidewalls of the first conductive layer pattern;

forming, on each of two sides of the first conductive layer pattern, a conductive sidewall spacer on the second insulation layer and the first insulation layer wherein the conductive sidewall spacers form a floating gate;

forming a third insulation layer on the conductive sidewall spacers such that the first, second and third insulation layers together completely surround the conductive sidewall spacers; and forming a continuous third conductive layer pattern on the first, second and third insulation layers, the continuous third conductive layer pattern conductively coupled to the first conductive pattern.

2. The method of claim 1, wherein the step of forming impurity regions in the substrate comprises the steps of:

forming low density impurity regions in the substrate; and forming high density impurity regions in the substrate.

3. The method of claim 2, wherein the step of forming low density impurity regions comprises:

forming a nitride film pattern on the first conductive layer pattern;

ion-implanting impurities in the substrate while using the nitride film patterns as a mask; and removing the nitride film pattern.

4. The method of claim 2, wherein the step of forming high density impurity regions comprises:

forming a nitride film pattern on the first conductive layer pattern;

ion-implanting impurities in the substrate while using the nitride film pattern and the conductive sidewall spacers as a mask; and removing the nitride film pattern.

5. The method of claim 1, wherein the first and third conductive layer patterns form control gates.

6. The method of claim 1, wherein the first and third conductive layer patterns and the conductive sidewall spacers are polysilicon.

7. The method of claim 1, wherein the second insulation layer is formed between the conductive sidewall spacers and the first conductive layer pattern.

8. The method of claim 1, wherein the third insulation layer is formed between the conductive layer sidewall spacers and the third conductive layer pattern.

9. The method of claim 1, wherein portions of the second insulation layer and the third insulation layer, which cover the conductive sidewall spacers, project above an upper surface of the first conductive layer pattern.

10. The method of claim 2, wherein a first low density impurity region and a first high density impurity region together form a source region, and wherein a second low density impurity region and a second high density impurity region together form a drain region.

11. The method of claim 10, wherein portions of the first insulation layer are formed over the source and drain regions.

12. The method of claim 11, wherein the portions of the first insulation layer formed over the source and drain regions are thinner than the portion of the first insulation layer on which the first conductive layer is formed.

* * * * *